(12) United States Patent
Chen et al.

(10) Patent No.: US 12,068,234 B2
(45) Date of Patent: *Aug. 20, 2024

(54) SEMICONDUCTOR STRUCTURE (71) Applicant: UNITED MICROELECTRONICS CORP., Hsin-Chu (TW)

(72) Inventors: Chun-Hung Chen, Tainan (TW); Ming-Tse Lin, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/200,580

(22) Filed: May 23, 2023

(65) Prior Publication Data

US 2023/0290719 A1 Sep. 14, 2023

Related U.S. Application Data (63) Continuation of application No. 17/943,215, filed on Sep. 13, 2022, now Pat. No. 11,699,646, which is a
(Continued)

(30) Foreign Application Priority Data

Sep. 15, 2020 (CN) .......................... 202010965238.3

(51) Int. Cl.
*H01L 27/08* (2006.01)
*H01L 21/48* (2006.01)
(Continued)

(52) U.S. Cl.
CPC ...... *H01L 23/49838* (2013.01); *H01L 21/486* (2013.01); *H01L 21/76898* (2013.01);
(Continued)

(58) Field of Classification Search
CPC ............. H01L 23/49838; H01L 21/486; H01L 21/76898; H01L 23/481; H01L 23/49827; H01L 23/642; H01L 24/13; H01L 24/16; H01L 27/01; H01L 2224/13023; H01L 2224/13024; H01L 2224/16113; H01L 2224/16147; H01L 2924/15311; H01L 25/0657; H01L 2224/0401;
(Continued)

(56) References Cited

U.S. PATENT DOCUMENTS 3,962,713 A 6/1976 Kendall
5,731,941 A 3/1998 Hargrove
(Continued)

FOREIGN PATENT DOCUMENTS

CN 1835224 A 9/2006
WO WO 2018125203 A * 7/2018

*Primary Examiner* — Niki H Nguyen
(74) *Attorney, Agent, or Firm* — Winston Hsu (57) ABSTRACT

A semiconductor structure includes an interposer substrate, an electronic device formed in a device region of the interposer substrate, a guard ring formed in the interposer substrate and surrounding the device region, a first redistribution layer on an upper surface of the interposer substrate and covering the device region and the guard ring, and a chip disposed on the first redistribution layer and overlapping the device region.

15 Claims, 11 Drawing Sheets

Related U.S. Application Data continuation of application No. 17/073,392, filed on Oct. 18, 2020, now Pat. No. 11,482,485.

(51) Int. Cl.
| | | |
|---|---|---|
| *H01L 21/768* | (2006.01) | |
| *H01L 23/00* | (2006.01) | |
| *H01L 23/48* | (2006.01) | |
| *H01L 23/498* | (2006.01) | |
| *H01L 23/64* | (2006.01) | |
| *H01L 27/01* | (2006.01) | |

(52) U.S. Cl.
CPC ...... *H01L 23/481* (2013.01); *H01L 23/49827* (2013.01); *H01L 23/642* (2013.01); *H01L 24/13* (2013.01); *H01L 24/16* (2013.01); *H01L 27/01* (2013.01); *H01L 2224/13023* (2013.01); *H01L 2224/13024* (2013.01); *H01L 2224/16113* (2013.01); *H01L 2224/16147* (2013.01)

(58) Field of Classification Search
CPC ....... H01L 2224/32225; H01L 2924/14; H01L 24/73; H01L 2225/06541; H01L 2224/04042; H01L 2224/16227; H01L 2224/16145; H01L 23/5226; H01L 2224/04105; H01L 2225/06513; H01L 2224/73253; H01L 2224/12105; H01L 24/08; H01L 21/76897; H01L 2224/0231; H01L 2224/08146; H01L 2225/1058; H01L 2924/18162; H01L 2224/80895; H01L 2225/107; H01L 2225/1064; H01L 23/53295; H01L 24/81; H01L 25/0652; H01L 2224/48137; H01L 23/5223; H01L 23/52; H01L 27/14636; H01L 2221/68331; H01L 21/76877; H01L 27/10829; H01L 23/3128; H01L 28/20

See application file for complete search history.

(56) References Cited

U.S. PATENT DOCUMENTS

| | | | |
|---|---|---|---|
| 8,212,332 B2 | 7/2012 | Chapman | |
| 8,232,648 B2 | 7/2012 | McGahay | |
| 8,558,346 B1 | 10/2013 | Cheng | |
| 8,618,640 B2 | 12/2013 | Lu | |
| 8,921,973 B2 | 12/2014 | Hirayu | |
| 9,064,719 B1 | 6/2015 | Zhou | |
| 9,142,581 B2 * | 9/2015 | Qian | H01L 27/14689 |
| 9,177,909 B2 | 11/2015 | Shih | |
| 9,331,062 B1 * | 5/2016 | Lane | H01L 21/76801 |
| 9,412,734 B2 | 8/2016 | Zhou | |
| 9,490,190 B2 * | 11/2016 | Lin | H01L 21/4882 |
| 9,679,855 B1 * | 6/2017 | Lee | H01L 23/544 |
| 10,079,277 B2 | 9/2018 | Yew | |
| 10,276,514 B1 * | 4/2019 | Wang | H01L 23/3142 |
| 10,354,980 B1 * | 7/2019 | Mushiga | H01L 21/76898 |
| 11,482,485 B2 * | 10/2022 | Chen | H01L 23/50 |
| 11,699,646 B2 * | 7/2023 | Chen | H01L 23/49827 257/531 |
| 2006/0267132 A1 | 11/2006 | Lee | |
| 2007/0102745 A1 | 5/2007 | Hsu | |
| 2008/0237806 A1 * | 10/2008 | Uchiyama | H01L 21/76898 257/621 |
| 2009/0052218 A1 * | 2/2009 | Kang | H01L 25/18 365/51 |
| 2009/0134500 A1 * | 5/2009 | Kuo | H01L 23/66 257/659 |
| 2011/0108948 A1 * | 5/2011 | Kim | H01L 21/76898 257/532 |
| 2011/0215470 A1 * | 9/2011 | Chen | H01L 23/52 257/773 |
| 2011/0260330 A1 * | 10/2011 | Seo | H01L 29/0692 257/774 |
| 2012/0074515 A1 * | 3/2012 | Chen | H01L 29/0619 257/491 |
| 2012/0119388 A1 * | 5/2012 | Cho | H01L 21/561 257/778 |
| 2012/0241981 A1 * | 9/2012 | Hirano | H01L 23/562 257/777 |
| 2013/0154048 A1 * | 6/2013 | Lu | H01L 23/481 438/667 |
| 2013/0270660 A1 * | 10/2013 | Bryzek | B81B 3/0021 438/51 |
| 2014/0015111 A1 * | 1/2014 | Ho | H01L 23/3185 257/620 |
| 2014/0021633 A1 * | 1/2014 | Lee | H01L 21/2885 257/774 |
| 2014/0252632 A1 * | 9/2014 | Barth | H01L 25/18 257/773 |
| 2015/0175406 A1 * | 6/2015 | Lin | B81B 7/007 438/51 |
| 2015/0270229 A1 * | 9/2015 | Kang | H01L 23/585 257/508 |
| 2015/0282367 A1 * | 10/2015 | Barth | H05K 13/00 361/728 |
| 2015/0302974 A1 * | 10/2015 | Zhao | H01F 41/046 336/200 |
| 2015/0311175 A1 * | 10/2015 | Ho | B81B 7/007 257/784 |
| 2017/0125356 A1 * | 5/2017 | Yang | H01L 24/96 |
| 2018/0005940 A1 * | 1/2018 | Chen | H01L 23/5226 |
| 2020/0210354 A1 * | 7/2020 | Fayneh | G11C 29/025 |
| 2021/0175133 A1 * | 6/2021 | Choi | H01L 23/544 |

\* cited by examiner

SEMICONDUCTOR STRUCTURE

CROSS REFERENCE TO RELATED APPLICATIONS

This application is a continuation application of U.S. application Ser. No. 17/943,215, filed on Sep. 13, 2022, which is a continuation application of U.S. application Ser. No. 17/073,392, filed on Oct. 18, 2020. The contents of these applications are incorporated herein by reference.

BACKGROUND OF THE INVENTION

1. Field of the Invention

The invention relates to a semiconductor structure. More particularly, the invention relates to a semiconductor structure including an interposer substrate having an electronic device and a guard ring formed therein.

2. Description of the Prior Art

In advanced semiconductor manufacturing, heterogeneous integration technology uses an interposer substrate to mount and electrically connect different chips such that a higher speed, a higher bandwidth and lower power consumption may be achieved. As demands for higher chip complexity and smaller package size are increased, how to further improve the integration degree and reduce the signal interferences between electronic devices in the semiconductor package structure has become an important topic in the field.

SUMMARY OF THE INVENTION

In light of the above, the present invention is directed to provide a semiconductor structure which may have increased integration degree and reduced signal interferences.

According to an embodiment of the present invention, a semiconductor structure is provided. The semiconductor structure includes an interposer substrate having an upper surface, a lower surface opposite to the upper surface, and a device region. An electronic device is formed in the device region of the interposer substrate. A guard ring is formed in the interposer substrate and surrounding the device region. A first redistribution layer is formed on the upper surface of the interposer substrate and covers the device region and the guard ring. A chip is disposed on the first redistribution layer and overlaps the device region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

The following detailed descriptions and illustrations, with reference to the corresponding drawings, are used to illustrate the embodiments that may be implemented according to the present invention. These embodiments have provided enough details to enable those skilled in the art to fully understand and implement the present invention. Structural, logical and/or electrical modifications may be made and applied to other embodiments without departing from the scope of the present invention.

To provide a better understanding of the present invention to those of ordinary skill in the art, the accompanying drawings are included to provide a further understanding of the embodiments, and are incorporated in and constitute a part of this specification. The drawings of the present invention are only schematic drawings, and the size proportions of the elements represented in the drawings may be adjusted according to design requirements. The positional descriptions of the elements shown in the drawing such as "upper" and "lower" are relative. The drawings may be rotated to show the same structures, which should also be included in the scope of the present invention.

The terms "wafer" and "substrate" used herein include any structure having an exposed surface onto which a layer is deposited according to the present invention, for example, to form the circuit structure. The term substrate is understood to include semiconductor wafers, but not limited thereto. The term substrate is also used to refer to semiconductor structures during processing, and may include other layers that have been fabricated thereupon.

It should be understood that the meaning of "on", "above", "over", "under", "below", "beneath" and the like in the present disclosure should be interpreted in the broadest manner such that these terms not only means "directly on something" or "directly under something" but also includes the meaning of "on something with an intermediate feature or a layer therebetween" or "under something with an intermediate feature or a layer therebetween".

Furthermore, spatially relative terms, such as "beneath", "below", "under", "lower", "above", "upper", "on", "over" and the like may be used herein to describe one element or feature's spatial relationship to another element(s) or feature(s) as illustrated in the figures. The spatially relative terms are intended to encompass different orientations of the device in use or operation in addition to the orientation depicted in the figures. The structure may be otherwise oriented (rotated 90 degrees or at other orientations) and the spatially relative descriptors used herein may likewise be interpreted accordingly.

Figure 1:
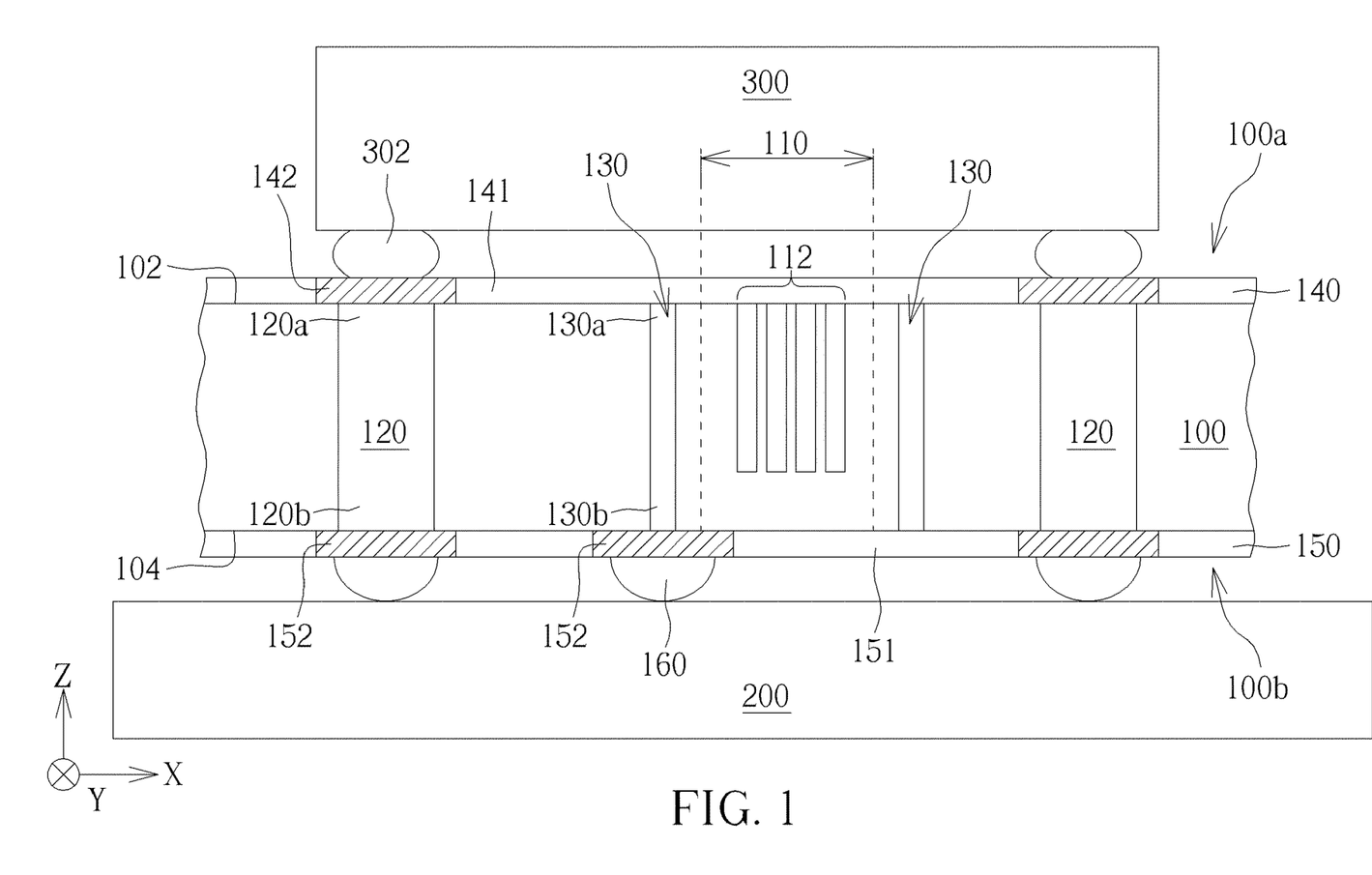
FIG. 1 is a schematic cross-sectional drawing of a portion of a semiconductor structure according to an embodiment of the present invention.

Please refer to FIG. 1, which is a schematic cross-sectional drawing showing a portion of a semiconductor structure according to an embodiment of the present invention. As shown in FIG. 1, the semiconductor structure includes an interposer substrate 100. The front side 100a of the interposer substrate 100 has an upper surface 102. The back side 100b of the interposer substrate 100 has a lower surface 104. The upper surface 102 and the lower surface 104 are opposed to each other, and both extend substantially along the plane defined by the X direction and the Y direction (also referred to as the XY plane). The interposer substrate 100 may include a silicon substrate or other suitable semiconductor substrates, but is not limited thereto. At least a device region 110 may be defined in the interposer substrate 100, and at least an electronic device 112 may be formed in the device region 110 by a semiconductor process. The electronic device 112 may include a passive device. For example, the electronic device 112 may include at least one of a capacitor, a resistor, or an inductor, but is not limited thereto. In some embodiments, the electronic device 112 does not include any active device. For example, the electronic device 112 does not include a transistor. By sharing a portion of the interposer substrate 100 as a device region 110 for disposing electronic devices such as capacitors, resistors or inductors, the integration degree of semiconductor structures may be increased. At least a guard ring 130 may be formed in the interposer substrate 110 and surrounds the device region 110.

The semiconductor structure further includes at least a through-silicon via (TSV) 120 (also called a through-substrate via) formed in the interposer substrate 100. In some embodiments, an end portion 130a of the guard ring 130 and an end portion 120a of the through-silicon via 120 may be flush with each other and both are exposed from the upper surface 102 of the interposer substrate 100. In some embodiments, another end portion 130b of the guard ring 130 and another end portion 120b of the through-silicon via 120 may be flush with each other and are exposed from the lower surface 104 of the interposer substrate 100.

In some embodiments, the semiconductor structure further includes a first redistribution layer (RDL) 140 formed on the upper surface 102 of the interposer substrate 100 and a second redistribution layer 150 formed on the lower surface 104 of the interposer substrate 100. The first redistribution layer 140 and the second redistribution layer 150 may respectively include at least a dielectric layer (for example, the dielectric layer 141 and the dielectric layers 151) and at least a conductive layer (for example, the conductive layer 142 and the conductive layer 152). The conductive layers 142, 152 may respectively include conductive lines for electrical connections in the horizontal direction (for example, the directions that are in the XY plane) and conductive vias for electrical connections in the vertical direction (for example, the Z direction that is perpendicular to the XY plane). The conductive layers 142, 152 may further include bump pads on which the bumps are formed. The dielectric layers of the first redistribution layer 140 and the second redistribution layer 150 may include inorganic dielectric materials such as silicon oxide ($SiO_2$) and silicon nitride (SiN), or organic dielectric materials such as polyimide (PI), but are not limited thereto. The conductive layers of the first redistribution layer 140 and the second redistribution layer 150 may include metals, such as aluminum (Al), copper (Cu), tungsten (W), titanium (Ti), titanium nitride (TiN), tantalum (Ta), tantalum nitride (TaN), or the like, but are not limited thereto. The first redistribution layer 140 may include at least a conductive line (not shown) that is electrically connected to the electronic device 112.

In some embodiments, the end portion 120a of the through-silicon via 120 may be electrically connected to the conductive layer 142 of the first redistribution layer 140, and the other end portion 120b of the through-silicon via 120 may be electrically connected to the conductive layer 152 of the second redistribution layer 150, such that the first redistribution layer 140 and the second redistribution layer 150 may be electrically connected by the through-silicon via 120.

In some embodiments, the end portion 130a of the guard ring 130 may be electrically connected to the second redistribution layer 150. In some embodiments, the guard ring 130 may be electrically connected to a ground voltage (or a reference voltage) through the second rewiring layer 150. The guard ring 130 may provide electronic shielding to the electronic device 112 of the device region 110 and reduces signal interferences.

In some embodiments, the semiconductor structure further includes at least a chip (or die) 300 disposed at the front side 100a of the interposer substrate 100 and oriented facing the upper surface 102 of the interposer substrate 100. In other words, the chip 300 is arranged above the interposer substrate 100 along the Z direction. In some embodiments, the chip 300 may be electrically connected to the conductive layer 142 of the first redistribution layer 140 through the micro bumps 302. The chip 300 may be an active integrated circuit chip with specific functions, such as a graphics processing unit (GPU), a central processing unit (CPU), or a memory chip, but is not limited thereto.

In some embodiments, the semiconductor structure further includes a circuit board (or a package substrate) 200 disposed at the back side 100b of the interposer substrate 100 and oriented facing the lower surface 104 of the interposer base 100. The circuit board 200 may be electrically connected to the conductive layer 152 of the second redistribution layer 150 through the bumps 160.

It should be noted that the configuration of the semiconductor chips 300, the interposer substrate 100 and the circuit board 200 shown in FIG. 1 is only an example. In other embodiments, a chip (or a die) may be disposed at the back side 100b of the interposer substrate 100 and oriented facing the lower surface 104, and/or a circuit board may be disposed at the front side 100a of the interposer substrate 100 and oriented facing the upper surface 102. These embodiments should also be included in the scope of the present invention.

Figure 2:
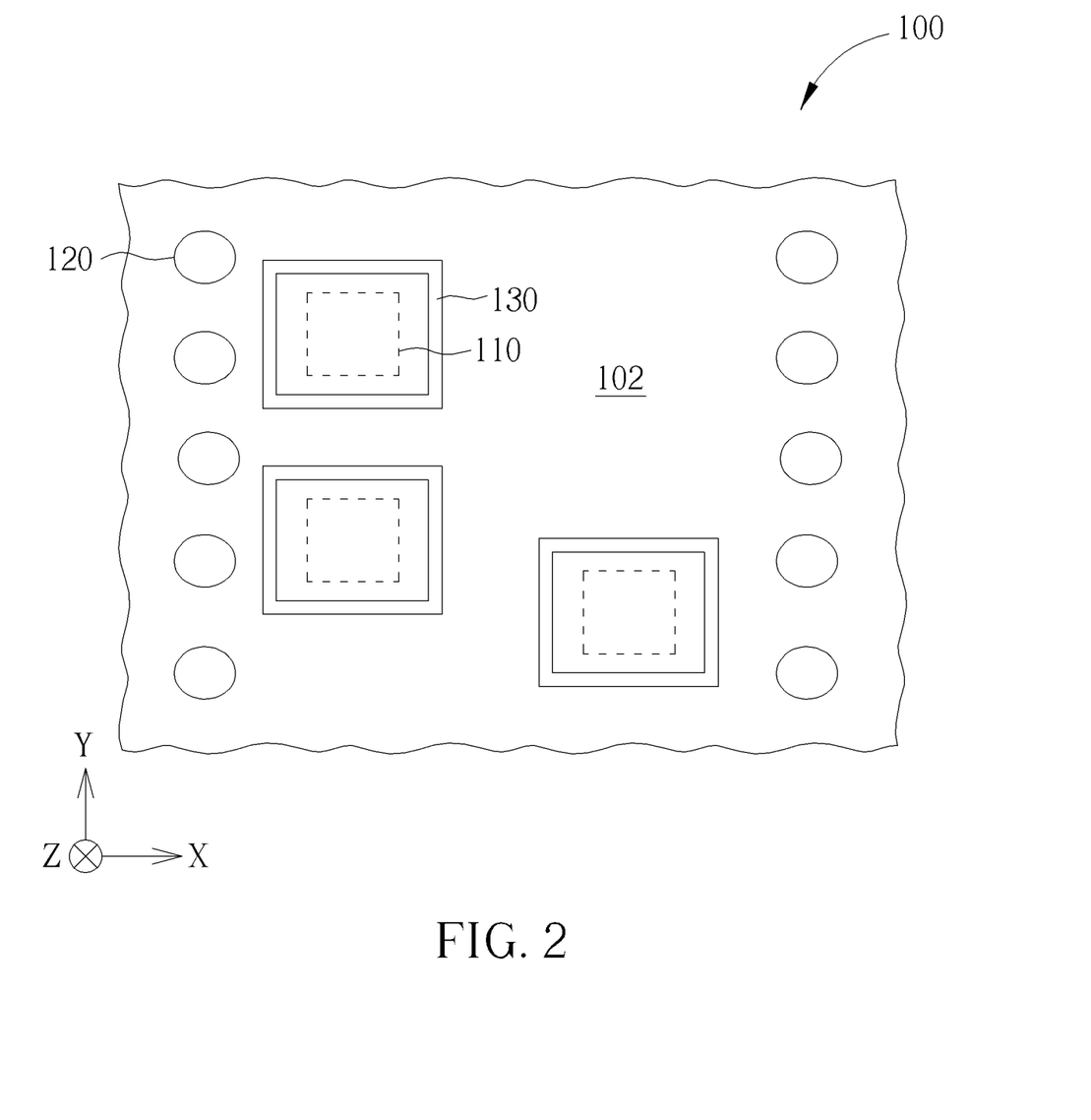
FIG. 2 is a schematic drawing showing a top view of a portion of an interposer substrate of a semiconductor structure according to an embodiment of the present invention.

Please refer to FIG. 2, which is a schematic top view of a portion of an interposer substrate 100 of a semiconductor structure according to an embodiment of the present invention. More specifically, FIG. 2 shows the top view when facing the upper surface 102 of the interposer substrate 100. The interposer substrate 100 may include a plurality of device regions 110, and each of the device regions 110 may be continuously surrounded by a guard ring 130 that has a closed-ring shape. The shape of the guard ring 130 may be adjusted according to the shape of the device region 110. For example, as shown in FIG. 2, when the device region 110 has a rectangular shape, the guard ring 130 may accordingly have a substantially rectangular ring shape. In other embodiments, shape of the guard ring 130 may be a circular ring, an elliptical ring or a polygonal ring according to application requirements, but is not limited thereto. The guard rings 130 may provide electronic shielding to the electronic devices formed in the device regions 110, and signal interference to the electronic devices may be reduced.

FIG. 3 to FIG. 6 are schematic cross-sectional drawings illustrating the steps of a method of fabricating a semiconductor structure according to an embodiment of the present invention. In this embodiment, the through-silicon via (TSV) 120 and the guard ring 130 may be simultaneously formed in the interposer substrate 100 by the same manufacturing processes. The through-silicon via 120 and the guard ring 130 in this embodiment may include the same materials and the same height.

Figure 3:
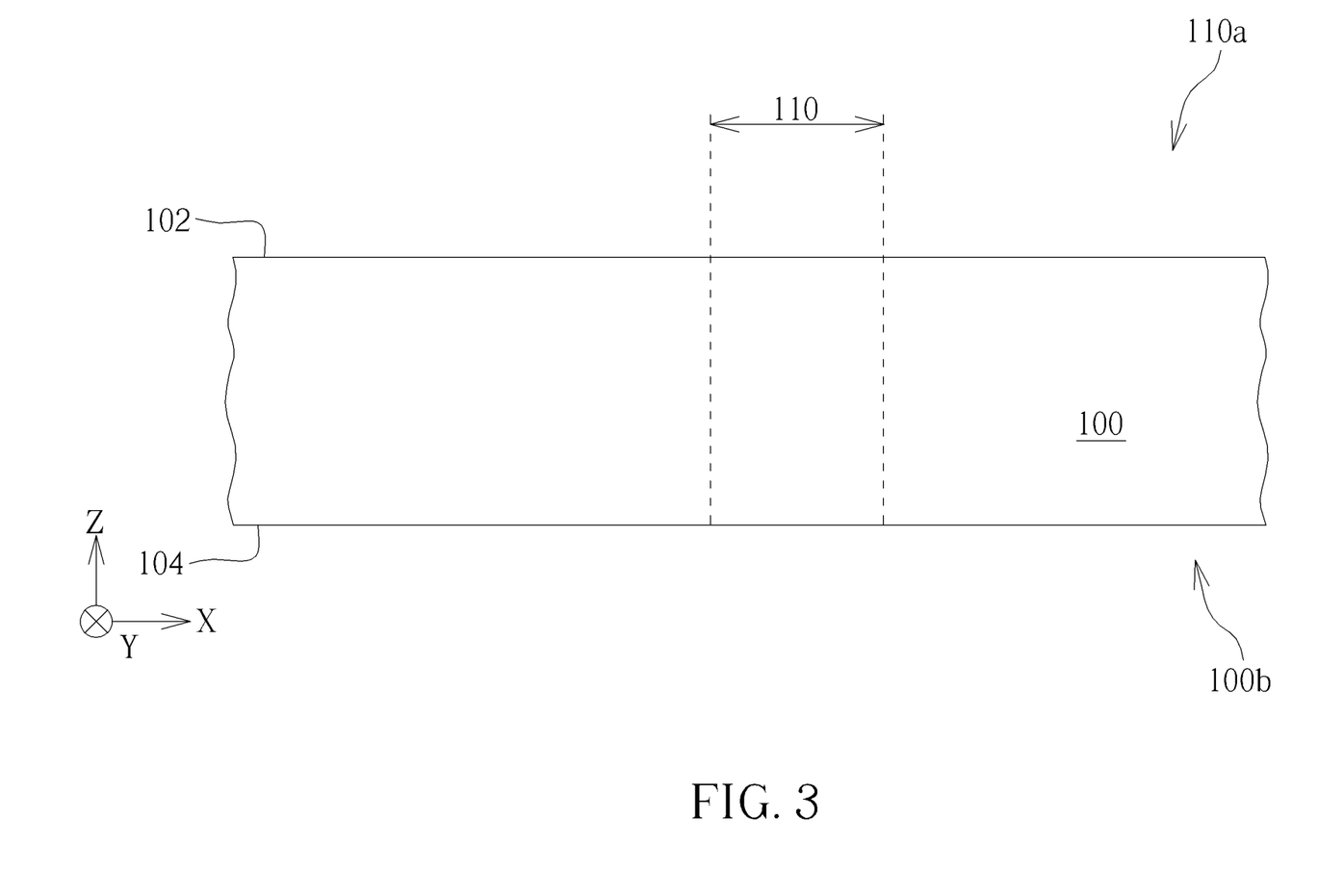
FIG. 3 to FIG. 6 are schematic cross-sectional drawings illustrating the steps of a method of fabricating a semiconductor structure according to an embodiment of the present invention.

Please refer to FIG. 3. First, an interposer substrate 100 is provided. The front side 100a of the interposer substrate 100 has an upper surface 102. The back side 100b of the interposer substrate 100 has a lower surface 104. At least a device region 110 is defined in the interposer substrate 100.

Figure 4:
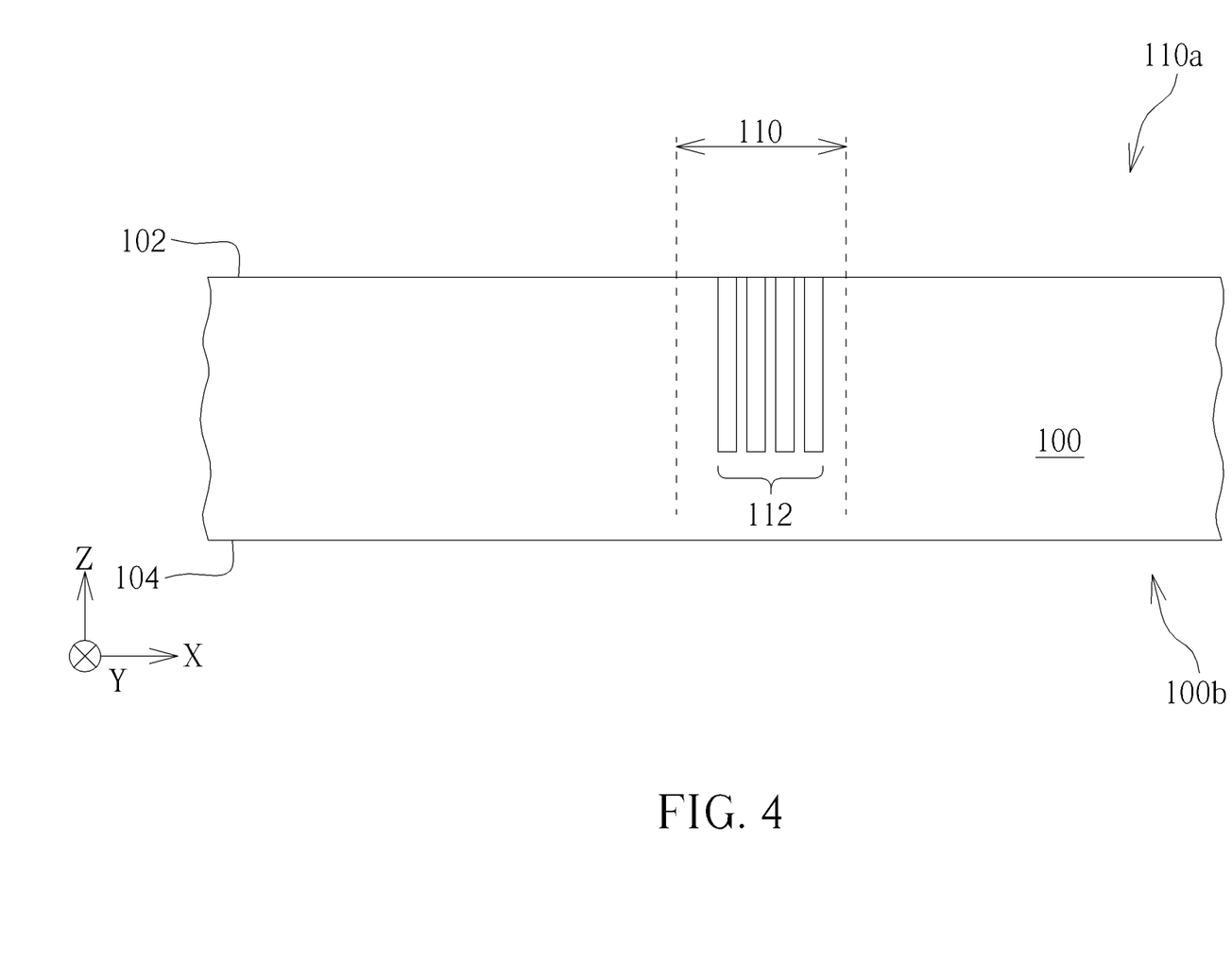

Please refer to FIG. 4. Subsequently, at least an electronic device 112 may be formed in the device region 110 from the front side 100a of the interposer substrate 100. The electronic device 112 may include a passive device, such as a capacitor, a resistor, or an inductor, but is not limited thereto. The electronic device 112 may be manufactured by conventional semiconductor manufacturing processes, such as lithography, etching, thin film deposition, and/or chemical mechanical polishing (CMP), but are not limited thereto. Detailed manufacturing processes of the electronic device 112 are not illustrated herein for the sake of simplicity.

Figure 5:
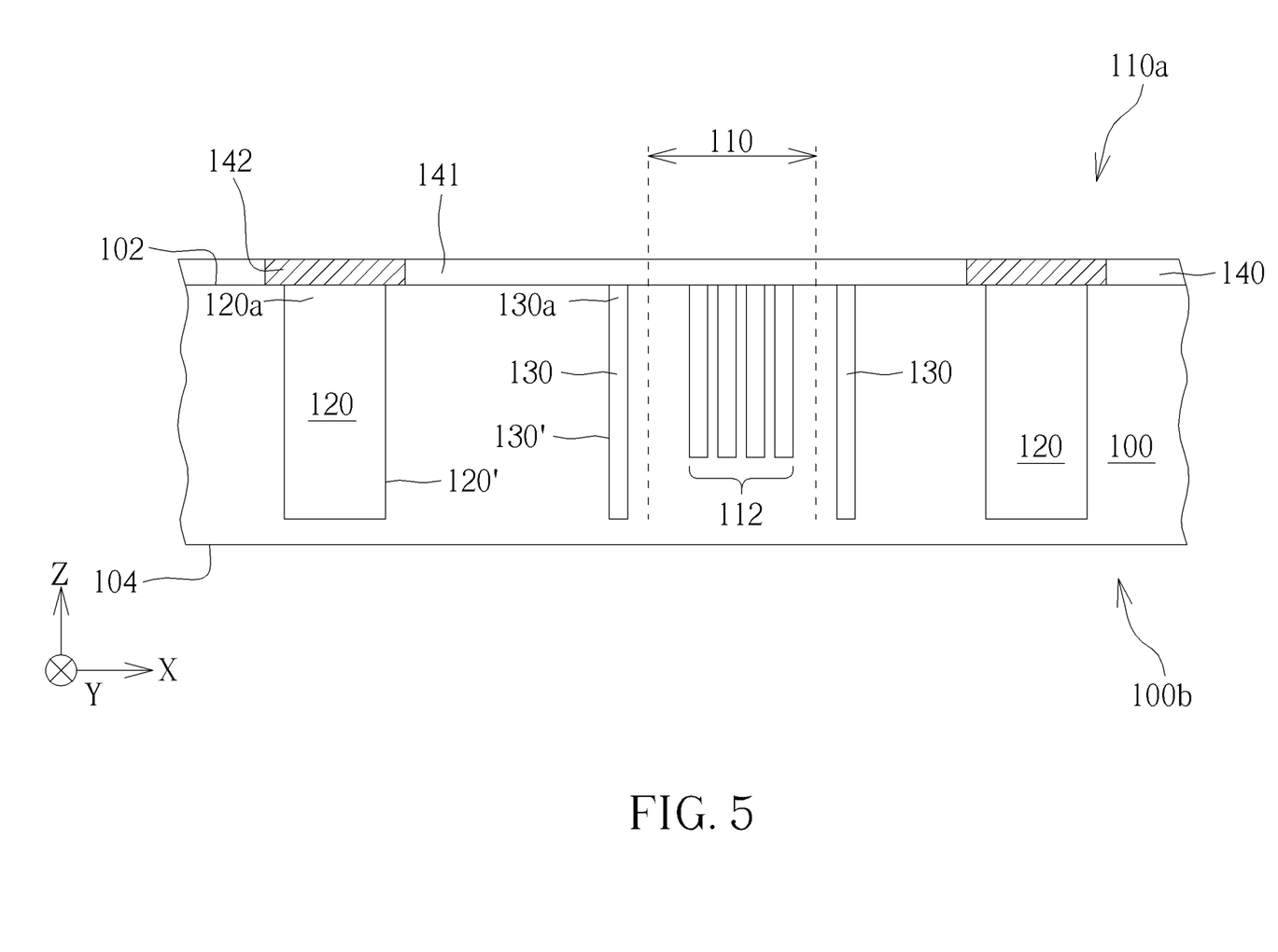

Please refer to FIG. 5. Subsequently, an optional pad layer (not shown) may be formed on the upper surface 102 to protect the electronic device 112 and/or as a stop layer for a subsequent polishing process. After that, a guard ring 130 and at least a through-silicon via (TSV) 120 are formed in the interposer substrate 100 from the front side 100a of the interposer substrate 100. The steps of forming the through-silicon via 120 and the guard ring 130 may include forming a trench 120' of the through-silicon via 120 and a trench 130' of the guard ring 130 that extend to a predetermined depth from the upper surface 102 in the interposer substrate 100 by, for example, a lithography-etching process, a laser drilling or other suitable processes. After that, a conductive material (such as aluminum (Al), copper (Cu), tungsten (W), titanium (Ti), titanium nitride (TiN), tantalum (Ta), tantalum nitride (TaN), or the like) may be formed on the interposer substrate 100 to fill the trench 120' and the trench 130'. Subsequently, a polishing process may be performed to remove the excess conductive material outside the trench 120' and the trench 130'. In this embodiment, the end portion 120a of the through-silicon via 120 and the end portion 130a of the guard ring 130 that are near the upper surface 102 of the interposer substrate 100 may be substantially at the same horizontal level and flush with each other. In some embodiments, when a pad layer (not shown) is formed on the upper surface 102, the end portion 120a of the through-silicon via 120 and the end portion 130a of the guard ring 130 may penetrate through the pad layer and are exposed from the pad layer.

Please still refer to FIG. 5. After forming the guard ring 130 and the through-silicon via 120, a first redistribution layer (RDL) 140 may be formed on the upper surface 102 of the interposer substrate 100. The first redistribution layer 140 may include at least a dielectric layer 141 and a conductive layer 142 that is formed in the dielectric layer 141. The end portion 120a of the through-silicon via 120 may be electrically connected to the conductive layer 142. In some embodiments, when a pad layer (not shown) is formed on the upper surface 102, a conductive via may be formed in the pad layer to electrically connect the end portion 120a of the through-silicon via 120 and the conductive layer 142.

Figure 6:
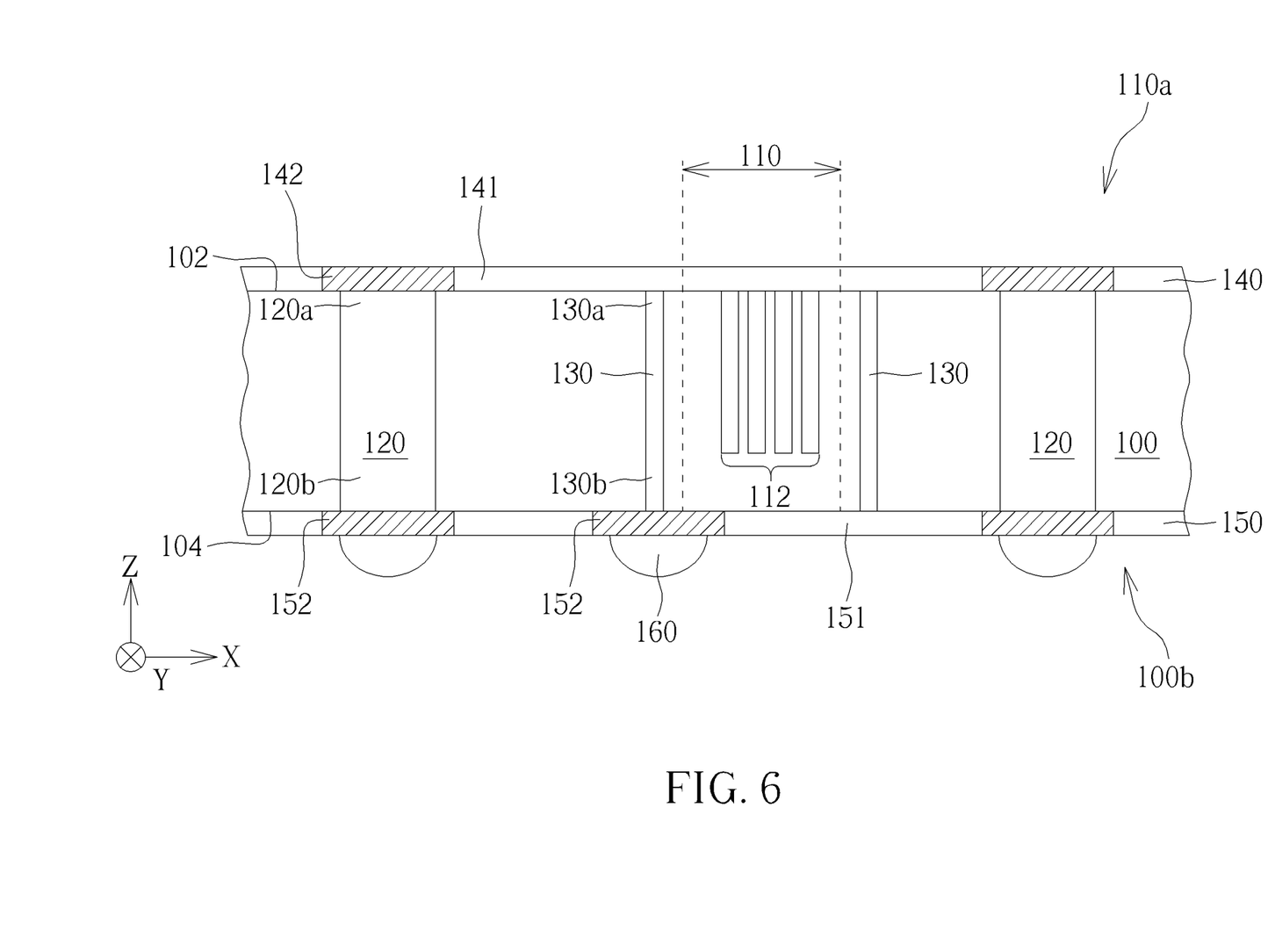

Please refer to FIG. 6. Subsequently, a polishing process may be performed on the lower surface 104 from the back side 100b of the interposer substrate 100 to thin the interposer substrate 100 to a desired thickness and to expose another end portion 120b of the through-silicon via 120 and another end portion 130b of the guard ring 130 that are near the lower surface 104. After that, a second redistribution layer 150 may be formed on the lower surface 104 of the interposer substrate 100. The second redistribution layer 150 may include at least a dielectric layer 151 and a conductive layer 152 that is formed in the dielectric layer 151. In this embodiment, the end portion 120b of the through-silicon via 120 and the end portion 130b of the guard ring 130 may be substantially at the same horizontal level and flush with each other, and are electrically connected to the conductive layer 152, respectively. Later, a plurality of bumps 160 may be formed on the second redistribution layer 150 for bonding the interposer substrate 100 to a circuit board or a package substrate.

Figure 7:
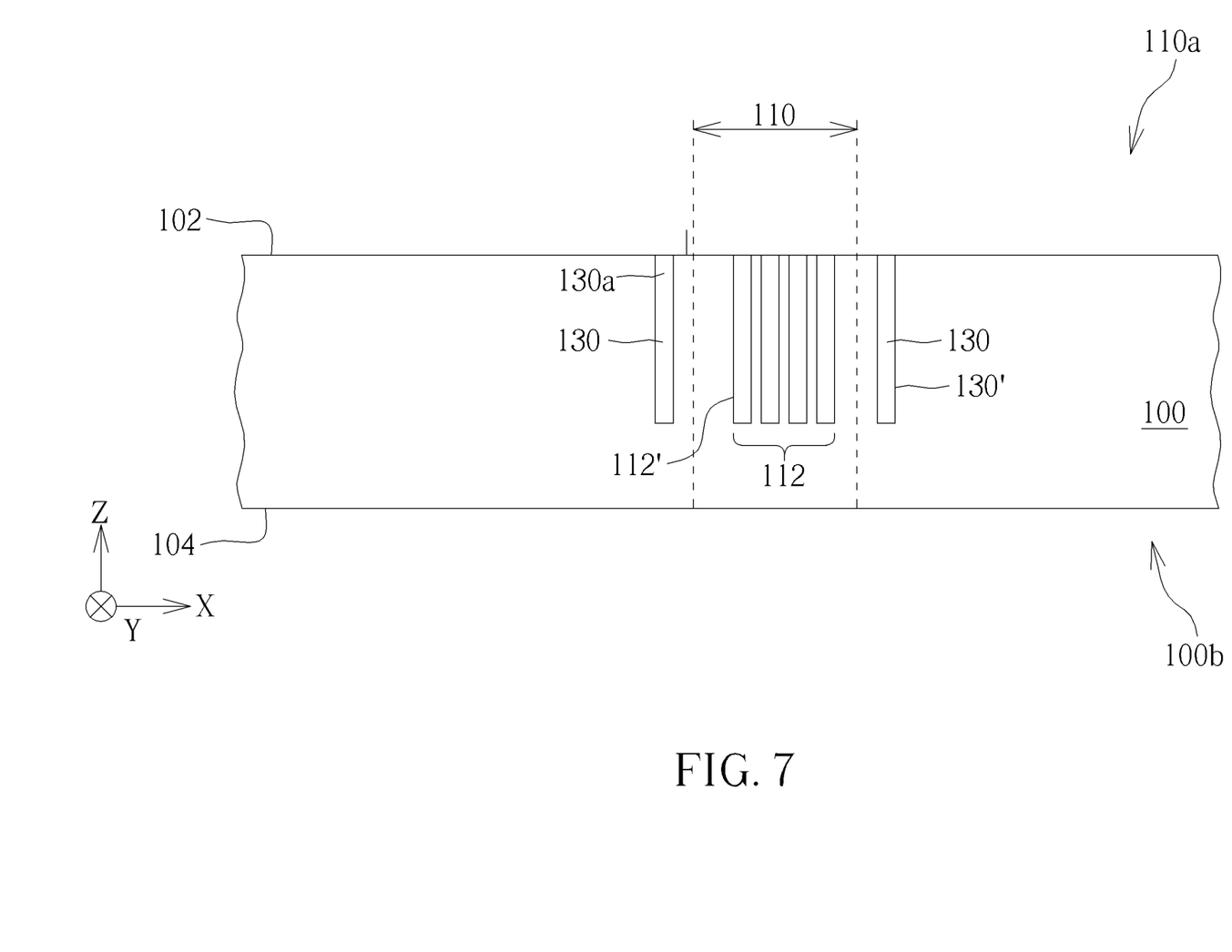
FIG. 7 to FIG. 9 are schematic cross-sectional drawings illustrating the steps of a method of fabricating a semiconductor structure according to another embodiment of the present invention.
Figure 8:
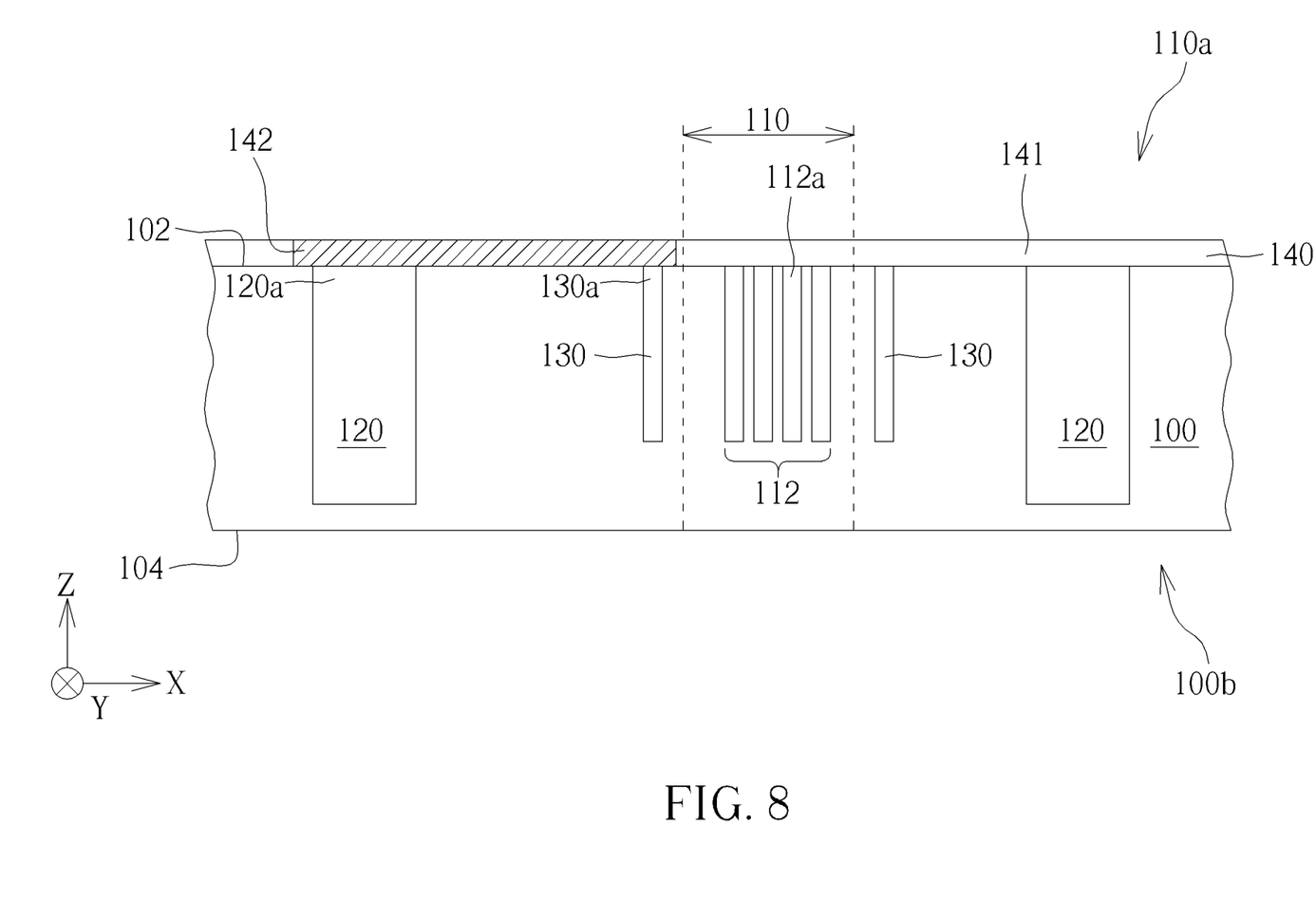
Figure 9:
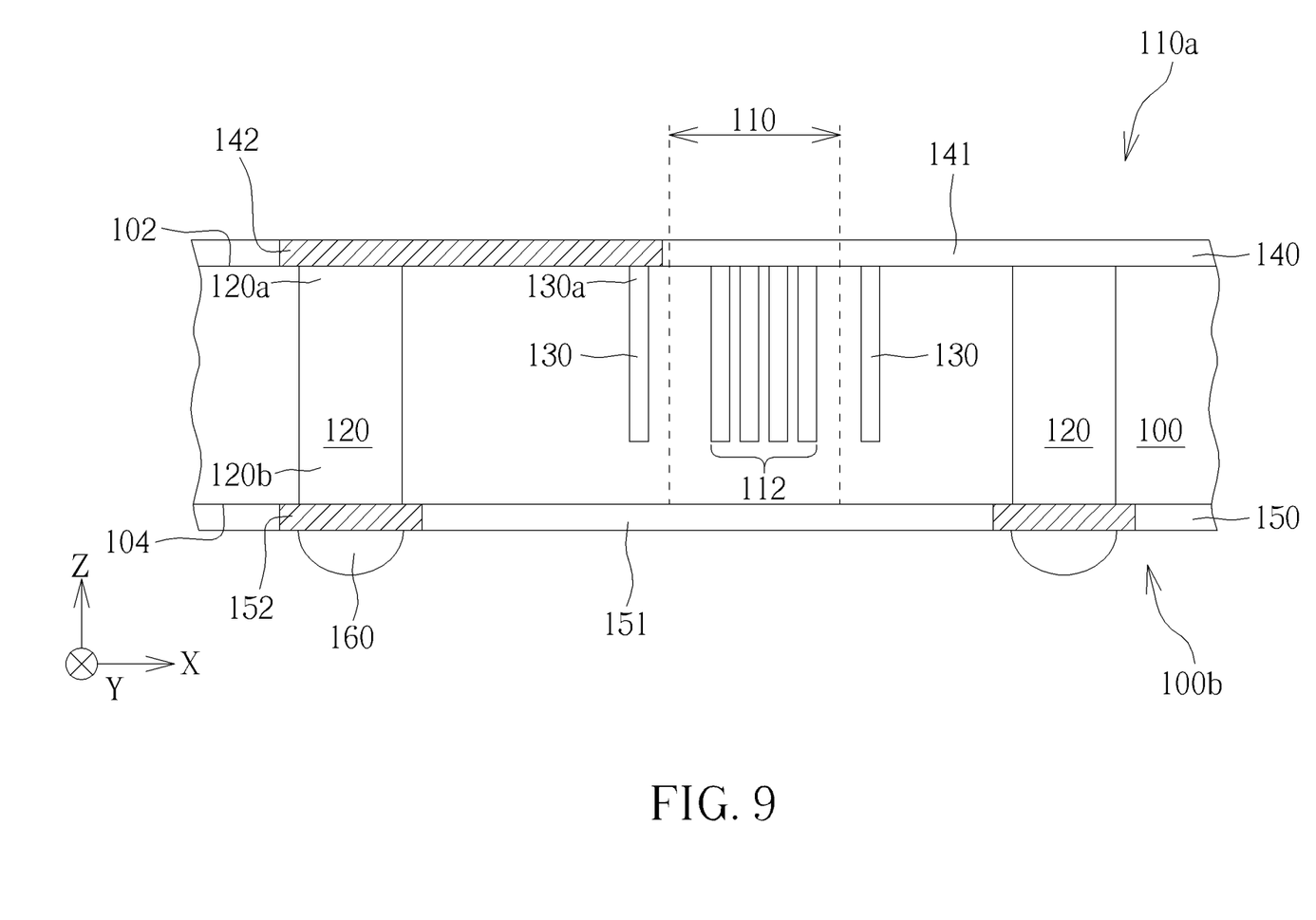

FIG. 7 to FIG. 9 are schematic cross-sectional views illustrating the steps of a method of fabricating a semiconductor structure according to another embodiment of the present invention. In this embodiment, the guard ring 130 and the electronic device 112 may be formed in the interposer substrate 100 at the same time by the same manufacturing processes. The guard ring 130 and the electronic device 112 may include the same materials and extend to the same depth in the interposer substrate 100.

Please refer to FIG. 7. First, an interposer substrate 100 is provided. The front side 100a of the interposer substrate 100 has an upper surface 102. The back side 100b of the interposer substrate 100 has a lower surface 104. At least a device region 110 is defined in the interposer substrate 100. Subsequently, an electronic device 112 in the device region 110 and a guard ring 130 surrounding the device region 110 are formed from the front side 100a of the interposer substrate 100. In this embodiment, the electronic device 112 may include, for example, a deep trench capacitor (DTC). The steps of forming the electronic device 112 and the guard ring 130 may include forming a trench 112' of the electronic device 112 and a trench 130' of the guard ring 130 that extend to a predetermined depth from the upper surface 102 in the interposer substrate 100 by, for example, a lithography-etching process, a laser drilling or other suitable processes. After that, a conductive-dielectric-conductive material stack layer may be formed on the interposer substrate 100 to fill the trench 112' and the trench 130'. Subsequently, a patterning process (such as a photolithography-etching process) may be performed to remove the excess conductive-dielectric-conductive material stack layer. The electronic device 112 and the guard ring 130 may respectively include a conductive material portion made of polysilicon or a metal such as aluminum (Al), copper (Cu), tungsten (W), titanium (Ti), titanium nitride (TiN), tantalum (Ta), tantalum nitride (TaN), or the like, but is not limited thereto. The electronic device 112 and the guard ring 130 may respectively include a dielectric material portion made of silicon oxide ($SiO_2$), silicon nitride (SiN), or high-k materials, but is not limited thereto. In this embodiment, an end portion 112a of the electronic device 112 and the end portion 130a of the guard ring 130 that are near the upper surface 102 of the interposer substrate 100 may be substantially at the same horizontal level and flush with each other.

Please refer to FIG. 8. After forming the electronic device 112 and the guard ring 130, an optional pad layer (not shown) may be formed on the upper surface 102 to protect the electronic device 112 and/or as a stop layer for a subsequent polishing process. Subsequently, at least a through-silicon via 120 may be formed in the interposer substrate 100 from the front side 100a of the interposer substrate 100. The steps of forming the through-silicon via 120 are as described above, and will not be repeated here. Afterward, a first redistribution layer 140 is formed on the upper surface 102 of the interposer substrate 100. In some embodiments, when a pad layer (not shown) is formed between the upper surface 102 and the first redistribution layer 140, conductive vias may be formed in the pad layer to electrically connect the electronic device 112 and the guard ring 130 to the first redistribution layer 140.

Please refer to FIG. 9. Subsequently, a polishing process may be performed on the lower surface 104 from the back side 100b of the interposer substrate 100 to thin the interposer substrate 100 to a desired thickness and to expose another end portion 120b of the through-silicon via 120 that is near the lower surface 104. After that, a second redistribution layer 150 is formed on the lower surface 104 of the interposer substrate 100. The end portion 120b of the through-silicon via 120 may be electrically connected to a conductive layer 152 of the second redistribution layer 150. Later, a plurality of bumps 160 may be formed on the second redistribution layer 150 for bonding the interposer substrate 100 to a circuit board or a package substrate. In some embodiments, as shown in FIG. 9, the end portion 130a of the guard ring 130 may be electrically connected to the end portion 120a of the through-silicon via 120 through the conductive layer 142 of the first redistribution layer 140, and then electrically connected to a ground voltage or a reference voltage through the through-silicon via 120 and the second redistribution layer 150.

Figure 10:
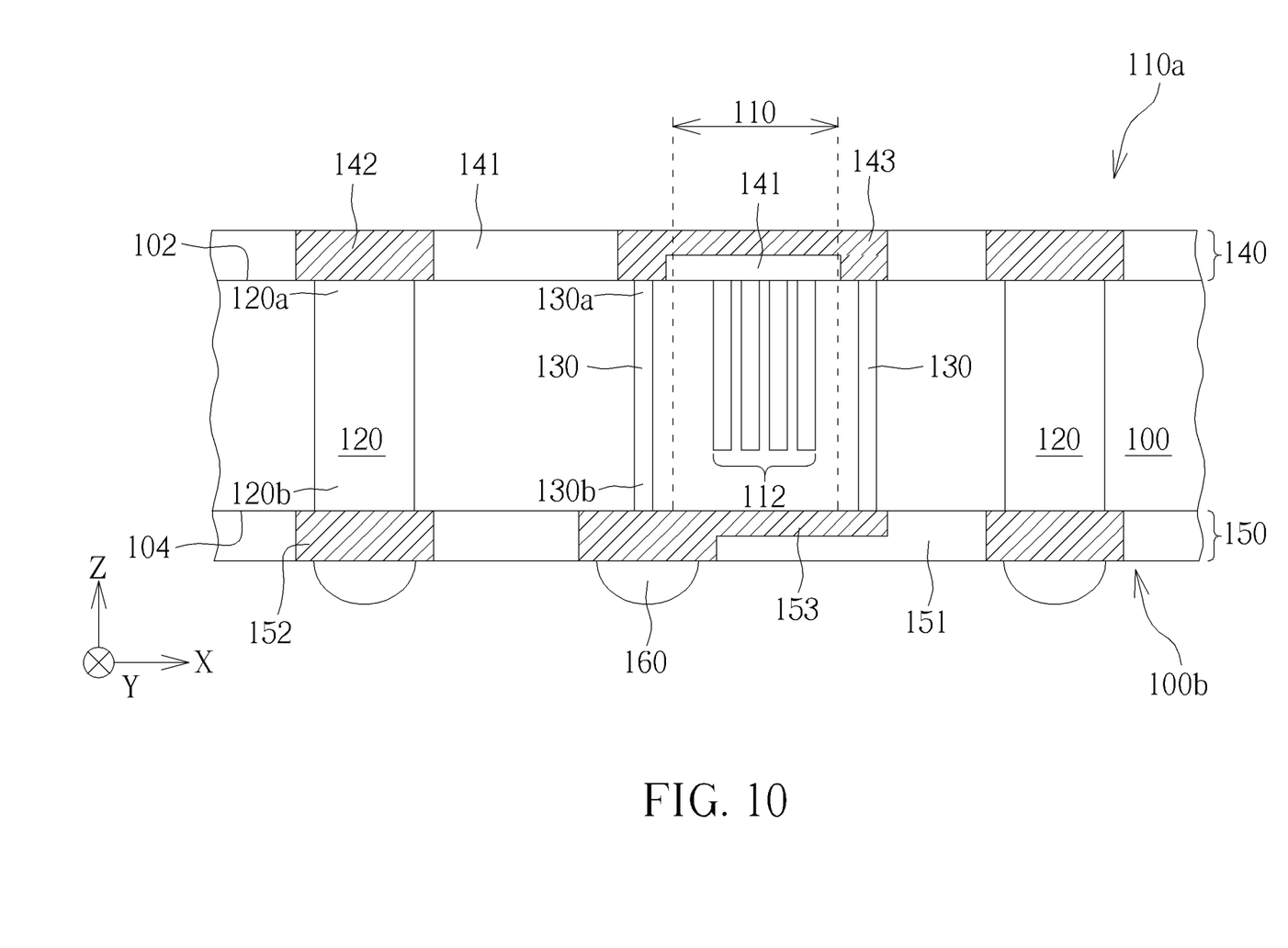
FIG. 10 is a schematic cross-sectional drawing of a portion of a semiconductor structure according to an embodiment of the present invention.

Please refer to FIG. 10, which is a schematic cross-sectional view of a portion of a semiconductor structure according to an embodiment of the present invention. In order to further enhance the electronic shielding effect of the electronic device 112, the semiconductor structure of the present invention may further include a first shielding layer 143 formed in the first redistribution layer 140 and a second shielding layer 153 formed in the second redistribution layer 150 and are disposed corresponding to the electronic device 112. The first shielding layer 143 may be formed in the dielectric layer 141 of the first redistribution layer 140 through the same processes of forming the conductive layer 142 and may include the same materials as the conductive layer 142. The second shielding layer 153 may be formed in the dielectric layer 151 of the second redistribution layer 150 through the same processes of forming the conductive layer 152 and may include the same materials as the conductive layer 152. In some embodiments, the first shielding layer 143 and the second shielding layer 153 may be respectively electrically connected to the end portion 130a and the end portion 130b of the guard ring 130, and are electrically connected to a ground voltage or a reference voltage to simultaneously provide horizontal and vertical electronic shielding to the electronic device 112. In other embodiments, the first shielding layer 143 and/or the second shielding layer 153 may be electrically floating. It should be understood that in some embodiments of the present invention, optionally, only one of the first redistribution layer 140 and the second redistribution layer 150 may have a shielding layer formed therein.

Figure 11:
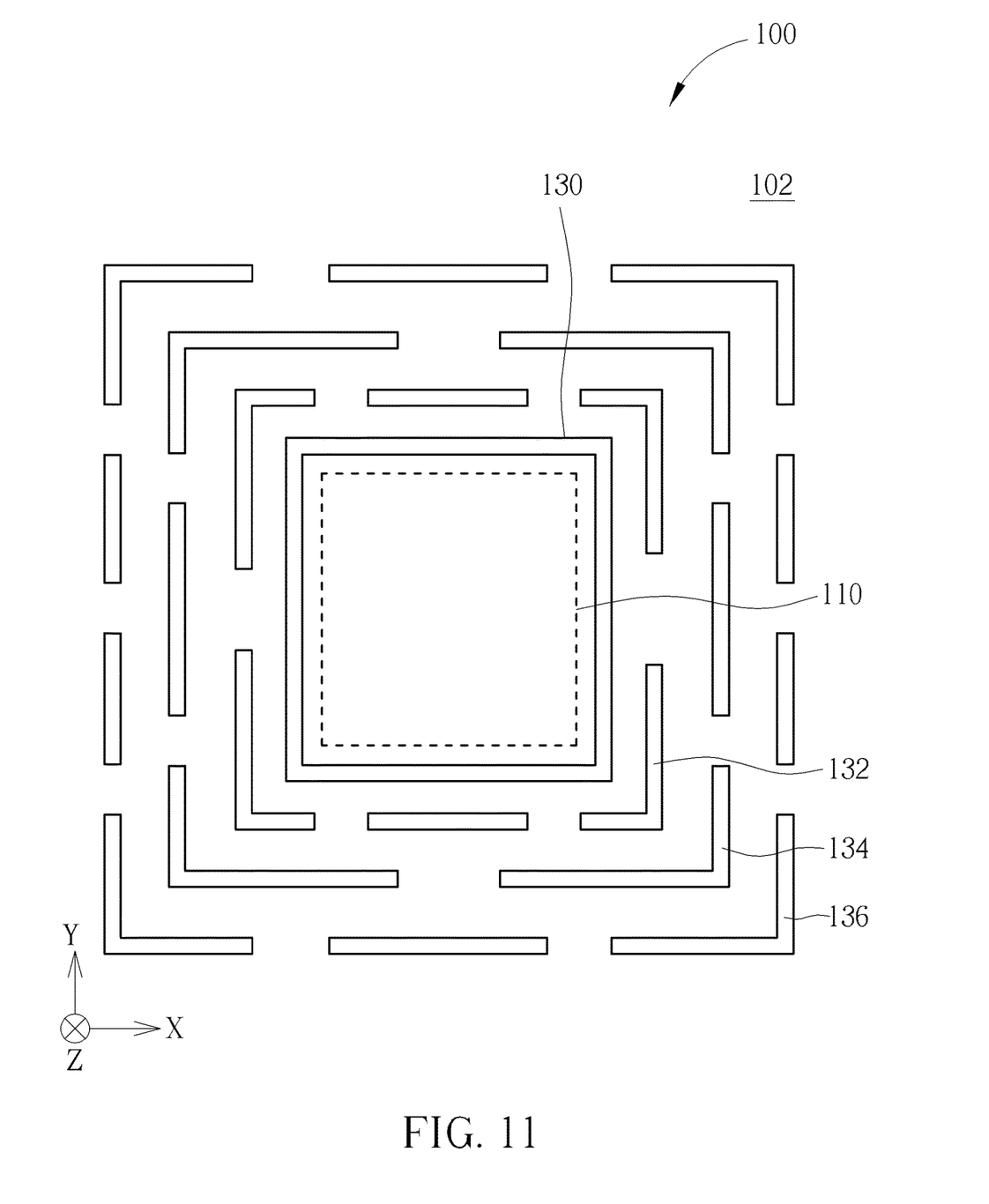
FIG. 11 is a schematic drawing showing a top view of a portion of an interposer substrate of a semiconductor structure according to an embodiment of the present invention.

Please refer to FIG. 11, which is a schematic top view of a portion of an interposer substrate 100 of a semiconductor structure according to an embodiment of the present invention. In order to further enhance the electronic shielding effect of the electronic device 112, the semiconductor structure of the present invention may further include at least one or more assistant guard rings formed in the interposer substrate 100 and surrounding the guard ring 130. For example, as shown in FIG. 11, an assistant guard ring 132, an assistant guard ring 134 and an assistant guard ring 136 may be formed in the interposer substrate 100. The guard ring 130 and the assistant guard rings 132, 134 and 136 together form a multiple concentric ring structure surrounding the device region 110. In some embodiments, the assistant guard ring 132, the assistant guard ring 134 and the assistant guard ring 136 may respectively has a non-continuous ring shape (or an open ring shape).

In some embodiments, the guard ring 130 and the assistant guard rings 132, 134 may be formed in the in the interposer substrate 100 at the same time through the same processes and may include the same materials. The assistant guard ring 132, the assistant guard ring 134 and the assistant guard ring 136 may be electrically connected to the first redistribution layer 140 and/or the second redistribution layer 150, respectively, and may be electrically connected to a ground voltage or a reference voltage. In some embodiments, it is optional to connect the guard ring 130, the assistant guard ring 132, the assistant guard ring 134, and the assistant guard ring 136 to different voltages, or to make anyone of them electrically floating. In some embodiments, by adjusting the shapes and arrangements of the assistant guard rings, the stress around the device region 110 may be relieved.

In summary, one feature of the present invention is that by sharing a portion of the interposer substrate as a device region for disposing electronic devices such as capacitors, resistors or inductors, the integration degree of semiconductor structures may be increased. Furthermore, a guard ring is formed in the interposer substrate and surrounding the device region to provide electronic shielding to the electronic devices, so that signal interference to the electronic device may be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor structure, comprising:
an interposer substrate having an upper surface, a lower surface opposite to the upper surface, and a device region;
an electronic device formed in the device region of the interposer substrate;
a guard ring formed in the interposer substrate and surrounding the device region;
a first redistribution layer on the upper surface of the interposer substrate and covering the device region and the guard ring; and
a chip disposed on the first redistribution layer and overlapping the device region.
2. The semiconductor structure according to claim 1, wherein the guard ring is electrically connected to a ground voltage or a reference voltage through the first redistribution layer.

3. The semiconductor structure according to claim 1, wherein the chip comprises a graphics processing unit, a central processing unit, or a memory.

4. The semiconductor structure according to claim 1, wherein the electronic device comprises a capacitor, a resistor, or an inductor.

5. The semiconductor structure according to claim 1, wherein the guard ring and the electronic device comprises same materials.

6. The semiconductor structure according to claim 1, further comprising a first shielding layer disposed in the first redistribution layer and overlapping the device region, wherein the first shielding layer is electrically connected to the guard ring.

7. The semiconductor structure according to claim 1, further comprising a plurality of micro bumps disposed between the first redistribution layer and the chip to electrically connect the first redistribution layer and the chip.

8. The semiconductor structure according to claim 1, further comprising:
a second redistribution layer disposed on the lower surface of the interposer substrate;
at least a through-silicon via (TSV) through the interposer substrate to electrically connect the first redistribution layer and the second redistribution layer.

9. The semiconductor structure according to claim 8, further comprising:
a circuit board at a side of the interposer substrate opposite to the chip; and
a plurality of micro bumps disposed between the second redistribution layer and the circuit board to electrically connect the second redistribution layer and the circuit board.

10. The semiconductor structure according to claim 8, wherein an upper end of the guard ring and an upper end of the TSV that are near the upper surface of the interposer substrate are flush with each other.

11. The semiconductor structure according to claim 8, wherein a lower end of the guard ring and a lower end of the TSV that are near the lower surface of the interposer substrate are flush with each other.

12. The semiconductor structure according to claim 8, wherein a height of the guard ring and a height of the TSV are the same.

13. The semiconductor structure according to claim 8, further comprising a second shielding layer disposed in the second redistribution layer and overlapping the device region, wherein the first shielding layer is electrically connected to the guard ring.

14. The semiconductor structure according to claim 1, wherein the guard ring has a closed-ring shape from a top view.

15. The semiconductor structure according to claim 1, further comprising at least an assistant guard ring surrounding the guard ring, wherein the assistant guard ring and the guard ring form a multiple concentric ring structure surrounding the device region.

* * * * *